United States Patent
DeAngelis et al.

(10) Patent No.: US 12,464,746 B1
(45) Date of Patent: Nov. 4, 2025

(54) ISOLATION STACK FOR A BIPOLAR TRANSISTOR AND RELATED METHODS

(71) Applicant: GlobalFoundries U.S. Inc., Malta, NY (US)

(72) Inventors: Jacob M. DeAngelis, Essex Junction, VT (US); Uppili S. Raghunathan, Essex Junction, VT (US); Steven M. Shank, Jericho, VT (US); Sarah A. McTaggart, Essex Junction, VT (US); Megan Elizabeth Lydon-Nuhfer, Essex Junction, VT (US); Cameron Luce, Colchester, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/945,645

(22) Filed: Nov. 13, 2024

(51) Int. Cl.
| | |
|---|---|
| H10D 10/80 | (2025.01) |
| H10D 10/01 | (2025.01) |
| H10D 62/10 | (2025.01) |
| H10D 62/13 | (2025.01) |
| H10D 62/17 | (2025.01) |

(52) U.S. Cl.
CPC ......... H10D 10/821 (2025.01); H10D 10/021 (2025.01); H10D 62/115 (2025.01); H10D 62/133 (2025.01); H10D 62/137 (2025.01); H10D 62/177 (2025.01)

(58) Field of Classification Search
CPC .................................................. H10D 10/821
See application file for complete search history.

(56) References Cited

U.S. PATENT DOCUMENTS

| | | | |
|---|---|---|---|
| 5,516,710 A | 5/1996 | Boyd et al. | |
| 6,869,852 B1 | 3/2005 | Joseph et al. | |
| 6,940,149 B1* | 9/2005 | Divakaruni | H10D 10/891 |
| | | | 438/340 |
| 6,964,907 B1* | 11/2005 | Hopper | H10D 10/051 |
| | | | 257/E21.375 |
| 7,214,593 B2 | 5/2007 | Coolbaugh et al. | |

(Continued)

FOREIGN PATENT DOCUMENTS

| | | |
|---|---|---|
| DE | 10042343 A1 | 3/2002 |
| DE | 102015208133 B3 | 8/2016 |
| EP | 4235796 A1 | 8/2023 |

OTHER PUBLICATIONS

Nguyen et al., "Pinch Off Plasma CVD Deposition Process and Material Technology for Nano-Device Air Gap/Spacer Formation," ECS Journal of Solid State Science and Technology, 7(10) P588-594, 2018, 4 pages.

(Continued)

*Primary Examiner* — William A Harriston
(74) *Attorney, Agent, or Firm* — Francois Pagette; Hoffman Warnick LLC (57) ABSTRACT

The disclosure provides an isolation stack for a bipolar transistor (BT), and related methods. A structure of the disclosure includes a first isolation layer on a subcollector. A first air gap is between the first isolation layer and a collector of a BT. A second isolation layer is on the first isolation layer and adjacent an intrinsic base of the BT. A third isolation layer is on the second isolation layer, vertically between the second isolation layer and an extrinsic base of the BT. A second air gap is adjacent the third isolation layer and below the extrinsic base.

17 Claims, 10 Drawing Sheets

(56) References Cited

U.S. PATENT DOCUMENTS

| | | |
|---|---|---|
| 7,462,923 B1 | 12/2008 | U'Ren |
| 7,709,338 B2 | 5/2010 | Liu et al. |
| 7,750,371 B2 | 7/2010 | Gluschenkov et al. |
| 7,846,805 B2 | 12/2010 | Zhang et al. |
| 7,883,954 B2 | 2/2011 | Magnee et al. |
| 7,952,165 B2 | 5/2011 | Cohen et al. |
| 8,067,290 B2 | 11/2011 | Boeck et al. |
| 8,395,217 B1 | 3/2013 | Cheng et al. |
| 8,405,127 B2 | 3/2013 | Chu et al. |
| 8,558,282 B1 | 10/2013 | Cai et al. |
| 8,853,043 B2 | 10/2014 | Hodge et al. |
| 9,029,229 B2 | 5/2015 | Adkisson et al. |
| 9,070,734 B2 | 6/2015 | Camillo-Castillo et al. |
| 9,093,491 B2 | 7/2015 | Adkisson et al. |
| 9,159,817 B2 | 10/2015 | Camillo-Castillo et al. |
| 9,202,900 B2 | 12/2015 | Adkisson et al. |
| 9,240,448 B2 | 1/2016 | Adkisson et al. |
| 9,245,951 B1 | 1/2016 | Camillo-Castillo et al. |
| 9,318,551 B2 | 4/2016 | Camillo-Castillo et al. |
| 9,368,608 B1 | 6/2016 | Camillo-Castillo et al. |
| 9,508,824 B2 | 11/2016 | Fox et al. |
| 9,570,564 B2 | 2/2017 | Alperstein et al. |
| 9,583,569 B2 | 2/2017 | Camillo-Castillo et al. |
| 9,653,566 B2 | 5/2017 | Camillo-Castillo et al. |
| 9,673,294 B2 | 6/2017 | Tschumakow et al. |
| 9,812,369 B2 | 11/2017 | Hoffmann et al. |
| 10,115,810 B2 | 10/2018 | Liu et al. |
| 10,186,605 B1* | 1/2019 | Gauthier ............ H10D 10/891 |
| 10,211,090 B2 | 2/2019 | Stamper et al. |
| 10,224,423 B1* | 3/2019 | Gauthier ............ H10D 10/80 |
| 10,312,356 B1 | 6/2019 | Liu et al. |
| 10,707,336 B1* | 7/2020 | Hashemi ............ H10D 10/80 |
| 10,818,772 B2 | 10/2020 | Jain et al. |
| 11,063,139 B2 | 7/2021 | Jain et al. |
| 11,145,741 B2* | 10/2021 | Gauthier ............ H10D 10/40 |
| 11,362,201 B1 | 6/2022 | McTaggart et al. |
| 12,342,555 B1 | 6/2025 | Raghunathan et al. |
| 2001/0017399 A1 | 8/2001 | Oda et al. |
| 2003/0109109 A1* | 6/2003 | Freeman ............ H10D 10/891 |
| | | 438/343 |
| 2004/0256635 A1 | 12/2004 | Saitoh et al. |
| 2005/0199907 A1* | 9/2005 | Divakaruni ......... H10D 10/021 |
| | | 438/235 |
| 2008/0179632 A1 | 7/2008 | Adam et al. |
| 2010/0187657 A1* | 7/2010 | Boeck ............... H10D 10/421 |
| | | 438/335 |
| 2011/0198671 A1* | 8/2011 | Boccardi ............ H10D 84/401 |
| | | 438/318 |
| 2013/0214275 A1 | 8/2013 | Adkisson et al. |
| 2014/0151852 A1* | 6/2014 | Adkisson ............ H10D 10/021 |
| | | 438/359 |
| 2015/0008558 A1 | 1/2015 | Harame et al. |
| 2015/0137185 A1 | 5/2015 | Camillo-Castillo et al. |
| 2015/0137186 A1 | 5/2015 | Leidy et al. |
| 2016/0190292 A1 | 6/2016 | Adkisson et al. |
| 2021/0036122 A1* | 2/2021 | Wong ................. H01L 21/764 |
| 2021/0257454 A1* | 8/2021 | Adusumilli ......... H10D 10/891 |
| 2021/0273082 A1* | 9/2021 | Brezza ............... H10D 84/038 |
| 2023/0131166 A1 | 4/2023 | Kirchgessner et al. |
| 2023/0187527 A1* | 6/2023 | John ................... H10D 10/80 |
| | | 257/197 |
| 2023/0230877 A1* | 7/2023 | Chung ............ H01L 21/76819 |
| | | 257/751 |
| 2024/0079473 A1 | 3/2024 | John et al. |
| 2025/0120144 A1 | 4/2025 | Raghunathan et al. |

OTHER PUBLICATIONS

Pekarik et al., "A 90nm SiGe BiCMOS Technology for mm-wave and high-performance analog applications," IEEE 2014, downloaded from IEEE Xplore on Sep. 10, 2024, 4 pages.

Vu et al., "Advanced Si/SiGe HBT architecture for 28-nm FD-SOI BiCMOS," IEEE 2016, downloaded from IEEE Xplore on Sep. 10, 2024, 4 pages.

Knoops et al., "Status and prospects of plasma-assisted atomic layer deposition," Research Article, Journal of Vacuum Science and Technology A 37, Mar. 18, 2019, 27 pages.

Mitchell, "The Role of the Silicon Germanium (SiGe) Heterojunction Bipolar Transistor (HBT) in Mobile Technology Platforms," Army Research Laboratory, ARL-TN-0459, Sep. 2011, 38 pages.

Jagannathan et al., "Self-Aligned SiGe NPN Transistors With 285 GHz fMAX and fT in a Manufacturable Technology," IEEE Electron Device Letters, vol. 23, No. 5, May 2002, pp. 258-260.

U.S. Appl. No. 18/481,632, filed Oct. 5, 2023, 47 pages.
U.S. Appl. No. 18/751,428, filed Jun. 24, 2024, 41 pages.
U.S. Appl. No. 18/905,278, filed Oct. 3, 2024, 47 pages.
U.S. Appl. No. 18/967,735, filed Dec. 4, 2024, 44 pages.
U.S. Appl. No. 19/045,068, filed Feb. 4, 2025, 60 pages.
U.S. Appl. No. 19/086,225, filed Mar. 21, 2025, 52 pages.
European Search Report for corresponding EP Application No. 24217336.7-1211 dated May 20, 2025, 9 pages.
U.S. Appl. No. 19/303,461 Application as Filed on Aug. 19, 2025, 47 pages.
European Search Report for corresponding EP Application No. 25168190.4-1211 dated Sep. 15, 2025, 11 pages.

* cited by examiner

ISOLATION STACK FOR A BIPOLAR TRANSISTOR AND RELATED METHODS

BACKGROUND

The present disclosure relates to bipolar transistor structures and methods to form such structures.

Present technology is at atomic level scaling of certain micro-devices such as logic gates, bipolar transistors, field effect transistors (FETs), and capacitors. Circuit chips with millions of such devices are common. The structure of a bipolar transistor defines several of its properties during operation. Bipolar transistors typically include multiple materials within its base terminal, i.e., the terminal for controlling current flow between the emitter and collector terminals of the bipolar transistor. A base terminal includes a relatively high conductivity extrinsic base having a terminal thereto, and a relatively low conductivity intrinsic base connected to the extrinsic base and located between the emitter and collector. Epitaxial growth of the extrinsic base on the intrinsic base, in some cases, may pose a risk of electrical shorting of the intrinsic base to any foundational materials (e.g., subcollector) located below the transistor. Other process-related risks, e.g., diffusion of dopants from one terminal to another, also may impede device performance.

SUMMARY

The illustrative aspects of the present disclosure are designed to solve the problems herein described and/or other problems not discussed.

Embodiments of the disclosure provide a structure including: a first isolation layer on a subcollector, wherein a first air gap is between the first isolation layer and a collector of a bipolar transistor (BT); a second isolation layer on the first isolation layer and adjacent an intrinsic base of the BT; and a third isolation layer on the second isolation layer, vertically between the second isolation layer and an extrinsic base of the BT, wherein a second air gap is adjacent the third isolation layer and below the extrinsic base.

Other embodiments of the disclosure provide a structure including: a bipolar transistor (BT) including a subcollector, a collector on the subcollector, an intrinsic base on the collector, an extrinsic base on a first portion of the intrinsic base, and an emitter on a second portion of the intrinsic base; and an isolation stack adjacent the BT, the isolation stack including: a first isolation layer on the subcollector, wherein a first air gap is between the first isolation layer and the collector, wherein a portion of the first air gap is above a portion of the collector; a second isolation layer on the first isolation layer and including a second isolation layer adjacent the intrinsic base of the BT; and a third isolation layer on the second isolation layer, vertically between the second isolation layer and the extrinsic base of the BT, wherein a second air gap is adjacent the third isolation layer and below the extrinsic base.

Additional embodiments of the disclosure provide a method including: forming a first isolation layer on a subcollector, wherein a first air gap is between the first isolation layer and a collector of a bipolar transistor (BT); forming a second isolation layer on the first isolation layer and adjacent an intrinsic base of the BT; and forming a third isolation layer on the second isolation layer, vertically between the second isolation layer and an extrinsic base of the BT, wherein a second air gap is adjacent the third isolation layer and below the extrinsic base.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The disclosure provides an isolation stack for a bipolar transistor (BT), and related methods. A structure of the disclosure includes a first isolation layer on a subcollector of a BT. A first air gap is between the first isolation layer and a collector of the BT. A second isolation layer is on the first isolation layer and adjacent an intrinsic base of the BT. A third isolation layer is on the second isolation layer, vertically between the second isolation layer and an extrinsic base of the BT. A second air gap is adjacent the third isolation layer and below the extrinsic base.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affects the size of the potential barrier. In the case of a junction between two semiconductor materials, the potential barrier will be formed along the interface between the two semiconductor materials. Generally, a BJT structure includes a base region vertically or horizontally between emitter and collector materials. A BJT can be either a PNP-type BJT or an NPN-type BJT. In a PNP-type BJT, the emitter and collector regions have P-type conductivity and at least a portion of the base region has N-type conductivity. In an NPN-type BJT, the emitter and collector regions have N-type conductivity and at least a portion of the base has P-type conductivity.

Figure 1:
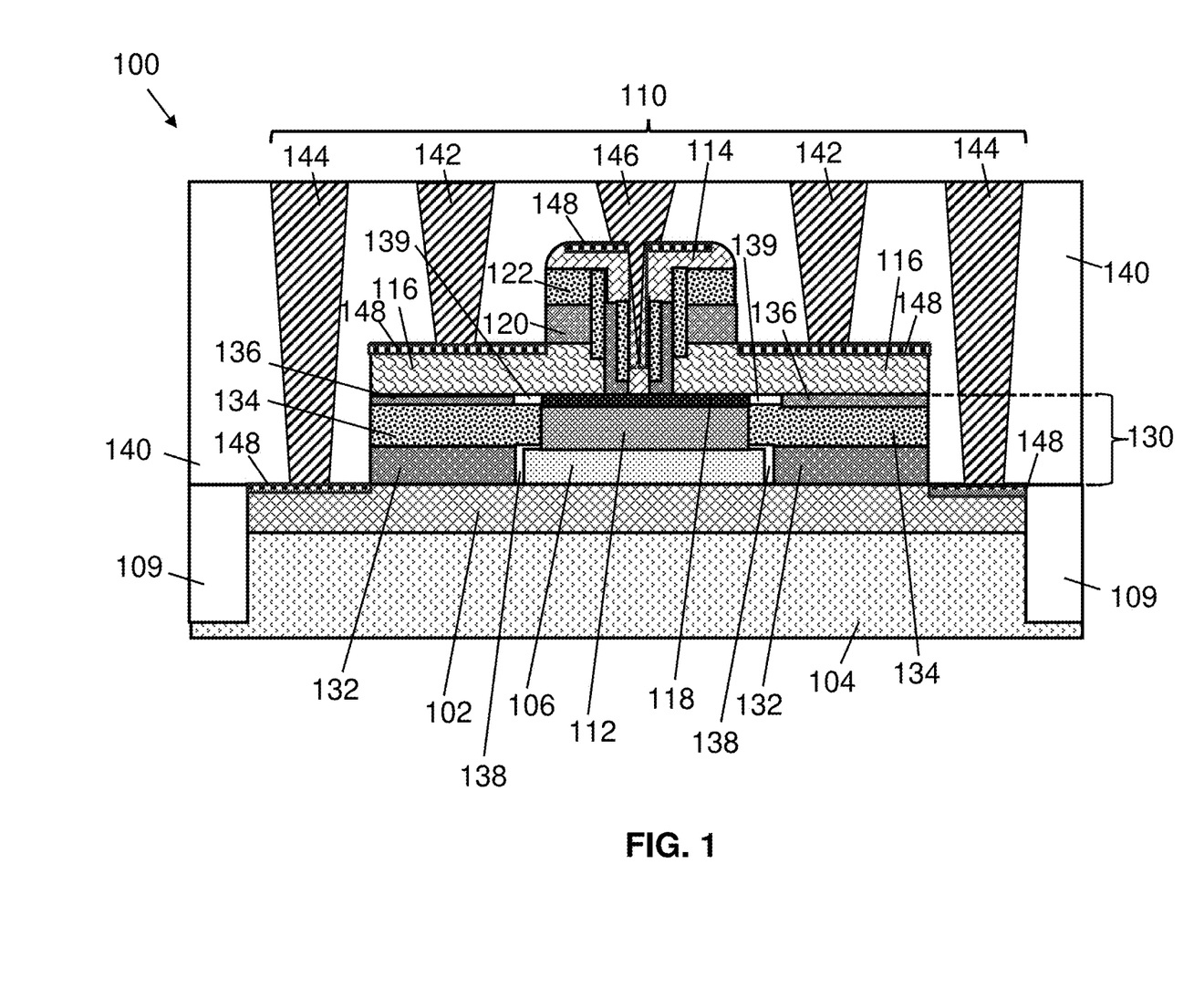
FIG. 1 depicts a cross-sectional view a structure according to embodiments of the disclosure.

Referring to FIG. 1, a structure 100 according to the disclosure may include: a bipolar transistor (also abbreviated as a "BJT" to indicate "bipolar junction transistor," or simply "BT") 110 (e.g., a vertically oriented bipolar transistor as discussed herein); and an isolation stack including multiple isolation layers and air gaps positioned laterally between at least two of the isolation layers and the BJT 110. Structure 100 may be formed on a subcollector 102 (i.e., a doped portion of a semiconductor substrate) including, e.g., one or more monocrystalline semiconductor materials. Subcollector 102 may include but is not limited to silicon, germanium, silicon germanium (SiGe), silicon carbide, or any other common IC semiconductor substrates. In the case of SiGe, the germanium concentration in subcollector 102 may differ from other SiGe-based structures described herein. A portion or entirety of subcollector 102 may be strained. Subcollector 102 may be doped (i.e., it may define a "doped well"), e.g., to enable coupling to the lower active semiconductor materials of a vertical bipolar transistor. Subcollector 102 may have any conceivable doping type and/or doping composition appropriate for use within and/or coupling to the collector terminal of a bipolar transistor. For instance, subcollector 102 may have the same dopant type as a collector 106 formed thereon, e.g., P-type doping in the case of a PNP-type BJT or N-type doping in the case of an NPN-type BJT, and/or may have a higher or lower dopant concentration therein.

Collector 106 may be on subcollector 102, e.g., as a single layer or multiple similarly doped but distinct layers formed by epitaxial deposition of silicon, SiGe, and/or other semiconductor materials on subcollector 102 and may have a predetermined doping type, e.g., by being doped in-situ or during formation of semiconductor material(s) of subcollector 102 and/or subcollector 102. Collector 106 is monocrystalline in structure. Collector 106 may define active semiconductor material of a vertical bipolar transistor, and thus may be vertically below other terminals (i.e., intrinsic base, extrinsic base, and emitter terminals discussed herein) of bipolar transistor 110. Collector 106 is illustrated as having vertical sidewalls over subcollector 102. However, collector 106 may have other shapes (e.g., sloped sidewalls, curved sidewalls, etc.) as a result of varying manufacturing techniques.

Insulator 109, which optionally may be subdivided into multiple layers and/or materials of varying width and/or depth, may also be on subcollector 102 to horizontally separate various active semiconductor materials on substrate 104. As shown, some insulators 109 may extend vertically into substrate 104, whereas others may be located on subcollector 102 to prevent electrical shorting between subcollector 102 and overlying areas of bipolar transistor 110. As discussed elsewhere herein insulator 109 initially may extend over substrate 104 as a single layer. Portions of insulator 109 may be removed to form a trench, which may undercut certain remaining portions of insulator 109 near subcollector 102. The undercut portions of insulator 109 may form substantially triangular divots, recesses, etc., where collector 106 material may be grown. Thus, collector 106 when formed may have a tapered or sloped shape, as shown. In cases where collector 106 has tapered sidewalls, various materials on collector 106 (e.g., intrinsic base 112 discussed herein) also may have tapered sidewall profiles, e.g., by selective epitaxial growth of additional material on collector 106.

Bipolar transistor 110 may include an intrinsic base 112 on collector 106. As illustrated, the top surface of intrinsic base 112 may be narrower in width than the top surface of collector 106. Intrinsic base 112 may include, e.g., monocrystalline SiGe or any other monocrystalline semiconductor material that is doped to have a predetermined polarity. Intrinsic base 112 may include a different semiconductor material (e.g., silicon germanium as opposed to silicon) than collector and 106 and an emitter 114 thereover. The use of differing semiconductor materials at the emitter-base junction and at the base-collector junction creates heterojunctions, which are, for example, suitable for handling higher frequencies. In this case, the BJT is referred to in the art as a heterojunction bipolar transistor (HBT). In the case where the bipolar transistor is an NPN-type transistor and subcollector 102, collector 106, and emitter 114 are doped n-type, intrinsic base 112 may be doped p-type to form a P-N junction, and hence a base-to-collector interface. It is also understood that intrinsic base 112 may be doped n-type in the case where the bipolar transistor is a PNP-type transistor. However embodied, intrinsic base 112 may extend to a predetermined height over collector 106. Intrinsic base 112 is illustrated with vertically extending sidewalls but may have sidewalls with a similar or different profile to collector 106 thereunder.

Intrinsic base 112 may be structurally and compositionally distinct from other portions of a base terminal for bipolar transistor 110. Intrinsic base 112 in particular may be lightly doped, or possibly undoped, whereas an extrinsic base 116 on intrinsic base 112 may be doped more highly than intrinsic base 112. Intrinsic base 112 may be formed, e.g., by forming a layer of semiconductor material, which may be monocrystalline silicon or SiGe as discussed herein, on collector 106. Additional semiconductor material may be formed through selective epitaxial growth and/or similar processes to form additional semiconductor material while preserving the crystallographic orientation and/or composition of the underlying material(s). Selective epitaxial growth of intrinsic base 112 in particular may maintain the shape and orientation of the sidewalls of collector 106.

Intrinsic base 112 also may include a semiconductor film 118 on its upper surface to enable deposition and growth of other semiconductor material(s) of different conductivity types on intrinsic base 112. Semiconductor film 118 may include, e.g., non-doped silicon (Si) in various crystalline forms, e.g., single crystallographic orientation Si, polycrystalline Si, etc. As discussed herein, semiconductor film 118 may be considered to be a part of intrinsic base 112 and may be formed by forming intrinsic base 112 material to a desired height before forming semiconductor film 118 thereon, and/or by removing a portion of intrinsic base 112 material for replacement with semiconductor film 118. Semiconductor film 118 also may be formed by any other currently known or later developed technique to form transitional semiconductor material suitable for subsequent forming of extrinsic base 116 and/or emitter 114 material thereon, having varying conductivity types and/or dopant concentrations. Intrinsic base 112 may include outer portions and a center portion between the outer portions.

Extrinsic base(s) 116 of bipolar transistor 110 may be on outer portion(s) of intrinsic base 112. Extrinsic base(s) 116 may include a polycrystalline semiconductor (e.g., polycrystalline SiGe) with a relatively high amount of the same doping type as (e.g., more p-type doping than) intrinsic base 112. Extrinsic base(s) 116 may be formed, e.g., by depositing an initial (seed) layer of monocrystalline and/or other semiconductor materials on intrinsic base 112. Through selective epitaxial growth, deposition, and/or other processing, extrinsic base(s) 116 can be formed from the initial layer to a desired height. Extrinsic base 116, by being formed through selective epitaxial growth may have sidewalls that are similarly shaped and/or substantially aligned with the sidewalls of intrinsic base 112 (and perhaps collector 106) thereunder.

Emitter 114 may be on the center portion of intrinsic base 112. In an example, emitter 114 may be horizontally between two extrinsic bases 116 and electrically isolated therefrom. Emitter 114 may be formed on and above intrinsic base 112, e.g., by forming a stack of materials including portions of extrinsic base(s) 116, removing a portion of the stack of materials, and forming emitter 114 and/or other components within and/or in place of the removed extrinsic base 116 material as discussed herein. Emitter 114 may have the same doping type as subcollector 102 and collector 106, and thus, has an opposite doping type relative to extrinsic base 116 (and intrinsic base 112, if doped). In the case where bipolar transistor 110 is an NPN device, collector 106 and emitter 114 may be doped n-type to provide the two n-type active semiconductor materials and intrinsic base 112 may be doped p-type. Emitter 114 may include polycrystalline silicon and/or other monocrystalline semiconductor materials, including one or more materials used elsewhere in structure 100 to form subcollector 102, collector 106, extrinsic base 116 (with different doping), etc.

One or more spacers, e.g., a first spacer 120 and a second spacer 122, may be adjacent emitter 114 and over adjacent portions of extrinsic base(s) 116. Portions of first spacer 120 and second spacer 122 also may extend vertically alongside emitter 114 such that they are horizontally between emitter 114 and extrinsic base(s) 116. First spacer 120 and second spacer 122 may have different compositions to control (e.g., increase) the electrical insulation between emitter 114 and extrinsic base 116. For instance, first spacer 120 may be a nitride based insulator formed alongside remaining portions of intrinsic base 112 and second spacer 122 may be an oxide based insulator formed on first spacer 120. Optionally, alternative configurations of first spacer 120 and/or second spacer 122 may be formed (e.g., as discussed in various examples of processing herein) to provide a particular arrangement of insulative materials between extrinsic base 116 and emitter 114. Other compositions and/or arrangements of spacers 120, 122 currently known or later developed also may be used. Spacer(s) 120, 122 thus may include oxide materials, nitride materials, and/or any other insulative material discussed herein, e.g., compositions similar to insulator 109 or other insulating structures. Spacer(s) 120, 122 be formed, e.g., by depositing layers of spacer material as part of a stack, removing portions of the stack where emitter 114 is desired, and optionally forming additional portions of spacer 120, 122 material to cover any exposed surfaces and inner sidewalls of extrinsic base 116 before other materials (e.g., emitter 114) are formed adjacent spacers 120, 122 and on a desired portion of semiconductor film 118. In some implementations, spacer(s) 120, 122 may include a single layer or more than two layers.

Structure 100 includes an isolation stack 130 on subcollector 102 for additional electrical and physical separation of bipolar transistor 110 from other components. Isolation stack 130 may include a first isolation layer 132 on subcollector 102, a second isolation layer 134 on first isolation layer 132, and a third isolation layer 136 on second isolation layer 134. As discussed herein, isolation stack 130 also includes a first air gap 138 between first isolation layer 132 and collector 106, and a second air gap 139 between third isolation layer 136 and semiconductor film 118 of intrinsic base 112. Isolation stack 130 may extend above subcollector 102 to approximately the same height as intrinsic base 112 and/or semiconductor film 118 thereof. Isolation stack 130 thereby allows extrinsic base(s) 126 to be formed on portions of isolation stack 130 and intrinsic base 112 (e.g., semiconductor film 118 thereof) simultaneously as discussed elsewhere herein.

First isolation layer 132 of isolation stack 130 may include, e.g., a first dielectric material such as an oxide-based insulator (e.g., silicon dioxide ($SiO_2$)), or other materials having similar properties. First isolation layer 132 may have the same composition as insulator 109 discussed herein, but this is not necessarily required and thus first isolation layer 132 is shown with different cross-hatching from insulator 109 where applicable. First isolation layer 132 may be formed, e.g., by deposition of desired material(s) on subcollector 102, insulator 109, etc. First isolation layer 132 may not abut intrinsic base 112 due to earlier etch opening in first isolation layer 132 before collector 106 is formed in that opening and before intrinsic base 112 is formed on collector 106, according to processes discussed herein.

Isolation stack 130 also may include second isolation layer 134 having, e.g., a nitride-based insulator such as silicon nitride (SiN). Second isolation layer 134 may have a different composition from first isolation layer 132, e.g., second isolation layer 134 may be nitride-based, whereas, as mentioned above, first isolation layer 132 may be oxide-based or vice versa. Second isolation layer 134 may extend horizontally over first isolation layer 132, and over air gap 138 (e.g., over an outer edge of collector 106), such that a sidewall of second isolation layer 134 horizontally abuts a portion of intrinsic base 112. In some cases, second isolation layer 134 may only horizontally abut a lower portion of intrinsic base 112 (e.g., areas below semiconductor film 118 and thus beneath air gap 139). Second isolation layer 134 initially may be formed as a continuous layer over first isolation layer 132, before portions of each layer 132, 134 are removed to enable forming of collector 106 and intrinsic base 112 thereon, as discussed in various examples herein.

Isolation stack 130 also may include a third isolation layer 136 on second isolation layer 134. Third isolation layer 136 also may be horizontally adjacent second air gap 139, such that second air gap 139 is horizontally between third isolation layer 136 and semiconductor film 118. Third isolation layer 136, in some cases, may have the same composition as first isolation layer 132. For example, isolation layers 132, 136 both may be oxide-based materials such as $SiO_2$ or any other currently known or later developed oxide-based insulator(s). In a further example, layers 132, 134, 136 of isolation stack 130 together may define an oxide-nitride-oxide (ONO) configuration over subcollector 102 and insulator(s) 109. Although layers 132, 134, 136 of isolation stack may have a substantially aligned sidewall over subcollector 102 distal to intrinsic base 112, their sidewalls proximate intrinsic base 112 may not be aligned due to air gaps 138, 139. These and other aspects of isolation stack 130 may be due to processing techniques implemented to form each layer 132, 134, 136 of isolation stack, and also may be attributable to the forming of collector 106, intrinsic base 112, and semiconductor film 118 as discussed herein. In any case, the position and shape of air gaps 138, 139 may, beneficially, further isolate collector 106, portions of intrinsic base 112, and/or other materials from certain components.

Figure 2:
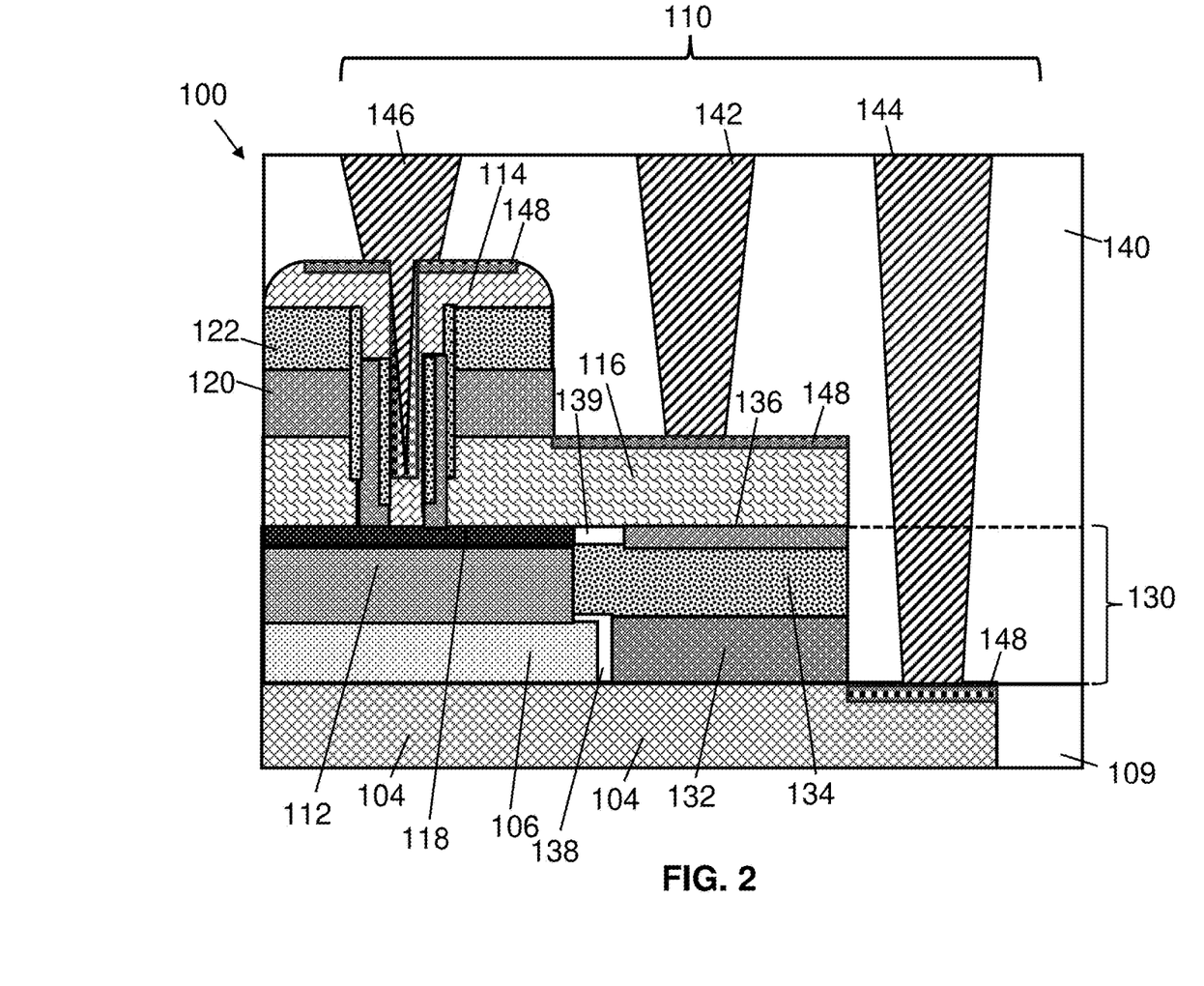
FIG. 2 depicts an expanded cross-sectional view a structure according to embodiments of the disclosure.

Referring now to FIG. 2, which provides an expanded view of structure 100 and a portion of bipolar transistor 110, various features of air gaps 138, 139 are discussed. The term "air gap," as used herein, refers to a region of space surrounded by (and hence not filled with) solid materials such as insulator 109, any layers of isolation stack 130, etc. Air gaps 138, 139, alternatively known as a "cavity," "gas dielectric," and/or similar terms known in the art, thus may have a lower dielectric constant (i.e., it is less conductive) than nearby insulative materials such layers 132, 134, 136 of isolation stack 130. Air gap 138, 139 thus may be formed by any currently known or later developed process to create an insulative region of space not filled with dielectric materials and/or other components, and various examples are provided herein.

Air gaps 138, 139 may be formed by any conceivable method to enclose and/or seal off a desired space to prevent additional materials from being formed therein. For instance, the forming and shaping of layers 132, 134 in isolation stack 130 may include removing a portion of second isolation layer 134 and first isolation layer 132 thereunder such that a remaining portion of second isolation layer 134 overhangs empty space previously occupied by a region of first isolation layer 132. By forming collector 106 on subcollector 102 in the area previously occupied by a portion of first isolation layer 132 by epitaxial growth and deposition, or similar techniques, the newly formed collector 106 material will not propagate horizontally. When the forming of collector 106 concludes, vacant space will remain between collector 106 and first isolation layer 132 to define at least a portion of first air gap 138.

First air gap 138, may extend alongside collector 106 and thus may have a similar shape to the adjacent portion(s) of collector 106. To affect the eventual shape of air gap 138, the forming of collector 106 may be controlled such that its upper surface is below the lower surface of second isolation layer 134. Techniques effective to produce this difference in height may include, e.g., terminating the forming of collector 106 after a certain amount of time, removing portions of collector 106 after it is formed to create a desired size, and/or various other combinations of currently known or later developed processes. Subsequent forming of intrinsic base 112 (e.g., by vertical deposition) on collector 106 may inhibit horizontal propagation of additional semiconductor material to define the shape of first air gaps 138. It is thus understood that first air gaps 138 can have any number of other shapes by further modifying the process(es) to form collector 106, intrinsic base 112, isolation stack 130, etc. Each first air gap 138 may be one of a pair of first air gaps 138, each horizontally adjacent a respective sidewall of collector 106.

In structure 100, second isolation layer 134 of isolation stack 130 is horizontally adjacent a portion (e.g., a lower and/or middle portion) of intrinsic base 112, such that the interface between intrinsic base 112 and isolation stack 130 partially defines a boundary of first air gap 138. Second air gap 139 also may be over second isolation layer 134. Second air gap 139 may be an area of space horizontally between an upper portion of intrinsic base 112 (e.g., having semiconductor film 118) and third isolation layer 136 of isolation stack 130. Second air gap 139 may be created from different phases and/or techniques in processing from those operable to form first air gap 138. For instance, to form second air gap 139, a portion of third isolation layer 136 material may be removed, e.g., by etching, to expose intrinsic base 112 and second isolation layer 134 thereunder. Subsequent processing may include forming semiconductor film 118 such that intrinsic base 112 has a desired height (e.g., to have an upper surface substantially coplanar with the upper surface of third isolation layer 136). The forming of semiconductor film 118 may not cause additional semiconductor material to propagate into empty space over second isolation layer 134, e.g., where semiconductor film 118 is formed by deposition. Second air gap(s) 139 may have a substantially rectangular shape with a height essentially equal to the height of third isolation layer 136, e.g., where second isolation layer 134 has a substantially flat upper surface and where the adjacent portion of third isolation layer 136 has substantially vertical sidewalls. Second air gap 139 optionally may take on different shapes, depending on the shape of isolation stack 130 and intrinsic base 112. Intrinsic base 112 on collector 106 also may include a sloped sidewall adjacent and/or below second air gap 139, e.g., in cases where intrinsic base 112 is formed by epitaxial growth or otherwise formed selectively on collector 106. Semiconductor film 118 also may extend horizontally over a portion of second isolation layer 134 such that the size and profile of second air gap 139 varies with the size and shape of semiconductor film 118.

Second air gap 139 may be provided as a pair of second air gaps 139, each horizontally adjacent a respective sidewall of intrinsic base 112 (e.g., alongside semiconductor film 118 thereof).

Each air gap 138, 139 may span horizontally between active material of bipolar transistor 110 and insulative material of isolation stack 130. Second isolation layer 134 of isolation stack 130 may vertically separate air gaps 138, 139 from each other. Underlying portions of subcollector 102, and optionally collector 106 in the case of an L-shaped region, may define the lower boundary of first air gap 138. Overlying portions of extrinsic base 116 may define the upper boundary of second air gap 139. First air gap 138 and second air gap 139 may have different shapes due to differences in the shape, size, and/or composition of adjacent materials defining each air gap 138, 139. Each air gap 138, 139, however shaped, may increase the electrical insulation between collector 106, intrinsic base 112, extrinsic base 116, and any interconnected parts of bipolar transistor 110 from other conductive or semiconductive materials in structure 100. Air gaps 138, 139 may be desirable as further contributing to the electrical isolation provided by isolation stack 130. Air gaps 138, 139 in particular may impede or prevent other physical interfaces from forming between bipolar transistor 110 and other materials, except where desired as discussed herein.

Structure 100 may include an inter-level dielectric (ILD) layer 140 over insulator 109, extrinsic bases 116, emitter 114, spacers 120, 122, etc. ILD layer 140 may include the same insulating material as insulator 109 or may include a different electrically insulative material for vertically separating active materials from overlying materials, e.g., various horizontally extending wires or vias. ILD layer 140 and insulator 109 nonetheless constitute different components, e.g., due to insulator 109 being vertically between subcollector 102 and the various active components of structure 100. ILD layer 140 may be formed by deposition and/or other techniques to provide electrically insulating materials, and can then be planarized (e.g., using CMP), such that its upper surface remains above any active components formed on subcollector 102.

A set of base contacts 142 through ILD layer 140 may provide the vertical electrical coupling to extrinsic base 116 from overlying metal wires and/or vias. Base contacts 142, notably, do not extend to intrinsic base 112. Intrinsic base 112 thus are coupled to base contacts 142 only through extrinsic base 116. Some portions of extrinsic base 116 may be converted into a silicide layer 148 to improve conductivity between each base contact 142 and any portions of extrinsic base 116 thereunder, e.g., by providing a conductive metal such as cobalt (Co), titanium (Ti), nickel (Ni), platinum (Pt), or similar material on the upper surface(s) of a targeted material. The conductive material(s) may be annealed while in contact with the underlying semiconductor to produce silicide layer 148 for electrically coupling semiconductor materials to any contacts formed thereon. Excess conductive material can then be removed using any now known or later developed solution, e.g., etching.

Structure 100 also includes an emitter contact 146 to emitter 114 and a collector contact 144 to collector 106 through subcollector 102. Each contact 146, 144 also may be coupled to emitter 114 or subcollector 102, respectively, through silicide layers 148 formed therein. Each contact 142, 144, 146 also may extend through ILD layer 140, thus collecting active semiconductor material within subcollector 102 or emitter 114 to overlying metal wires, vias, etc., above structure 100. Contact(s) 142, 144, 146 optionally may be formed as part of a single operation, e.g., by removing portions of ILD layer 140 to form openings, forming silicide layers 148 on semiconductor materials exposed within the openings, and filling the openings with metal to define each contact 142, 144, 146. One or more of contacts 142, 144, 146 may include refractory metal liners (not separately shown) on their sidewalls to impede or prevent electromigration degradation, shorting to other components, etc.

Some portions subcollector 102, emitter 114, and extrinsic base 1116 may be converted into a silicide layer 148 to improve conductivity between each contact 142, 144, 146 and any active material thereunder, e.g., by providing a conductive metal such as cobalt (Co), titanium (Ti), nickel (Ni), platinum (Pt), or similar material on the upper surface(s) of a targeted material. The conductive material(s) may be annealed while in contact with the underlying semiconductor to produce silicide layer 148 for electrically coupling semiconductor materials to any contact(s) formed thereon. Excess conductive material can then be removed using any now known or later developed solution, e.g., etching.

Figure 3:
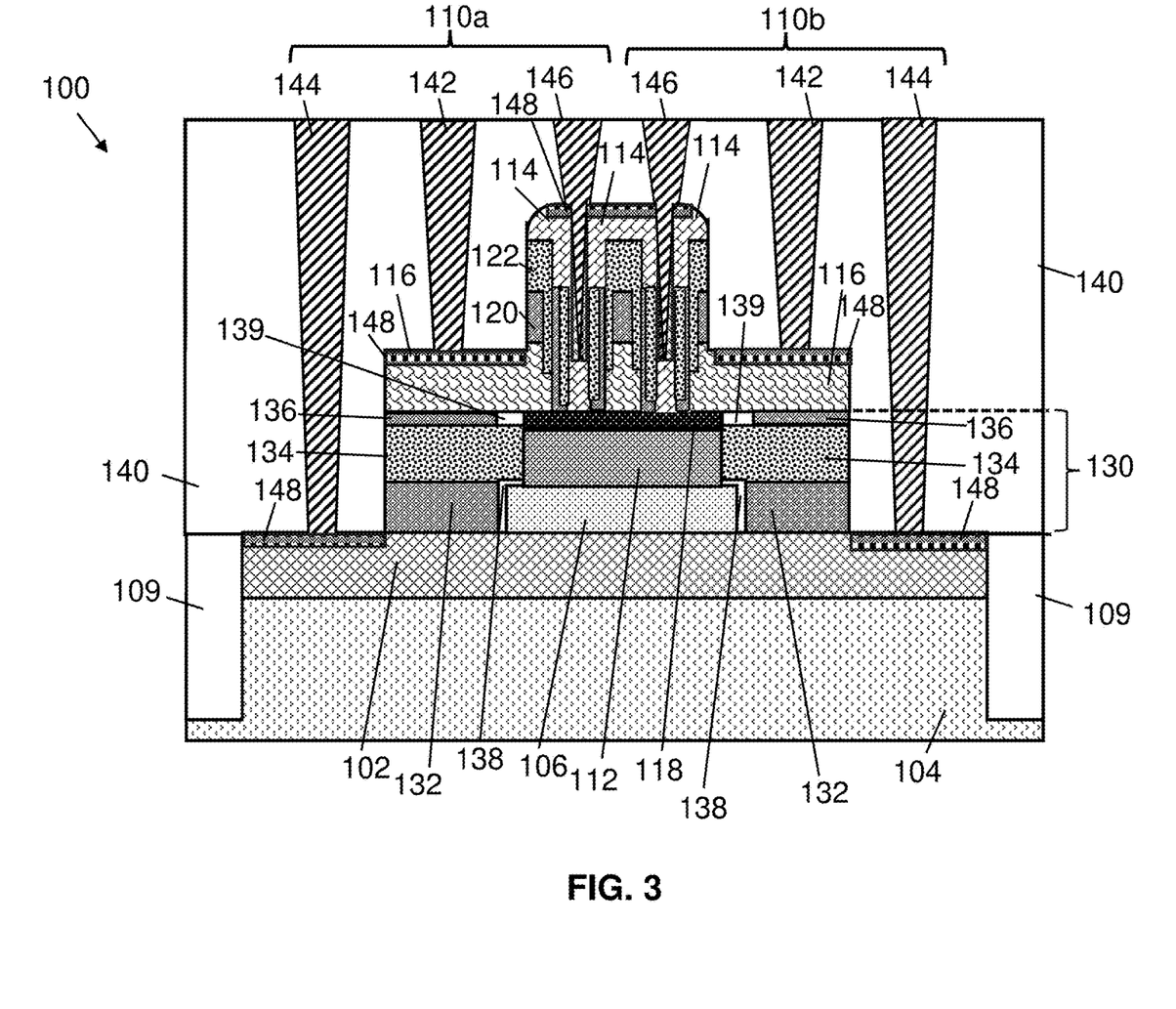
FIG. 3 depicts a cross-sectional view of a structure according to further embodiments of the disclosure.

FIG. 3 depicts a further implementation of structure 100 in which bipolar transistor 110 may have multiple emitters 114, also known as "emitter fingers" on one intrinsic base 112. In conventional settings, the likelihood of electrical shorting from intrinsic base 112 to nearby conductive elements makes the forming of multiple emitters 114 on one intrinsic base 112 impractical. For instance, increasing the amount of semiconductor material with multiple emitters 114 increases electrical activity (e.g., charge buildup) within intrinsic base 112 and consequently increases the chance of electrical shorting from intrinsic base 112 to nearby components (e.g., direct pathways from intrinsic base 112 to subcollector 102, contacts 142, 144, 146, etc.). The presence of air gaps 138, 139 alongside collector 106 and intrinsic base 112, however, offsets or even neutralizes the additional electrical activity created by current in multiple emitters 114, thus enabling bipolar transistor 110 to operate under such circumstances. Embodiments of the disclosure thus may allow multiple emitters 114 and contacts 146 thereto to be implemented where desired in various circuit configurations. It is understood, however, that implementations using multiple emitters 114 are optional; a single emitter 114 may be used and the insulating benefits of air gaps 138, 139 can nonetheless be retained.

Figure 4:
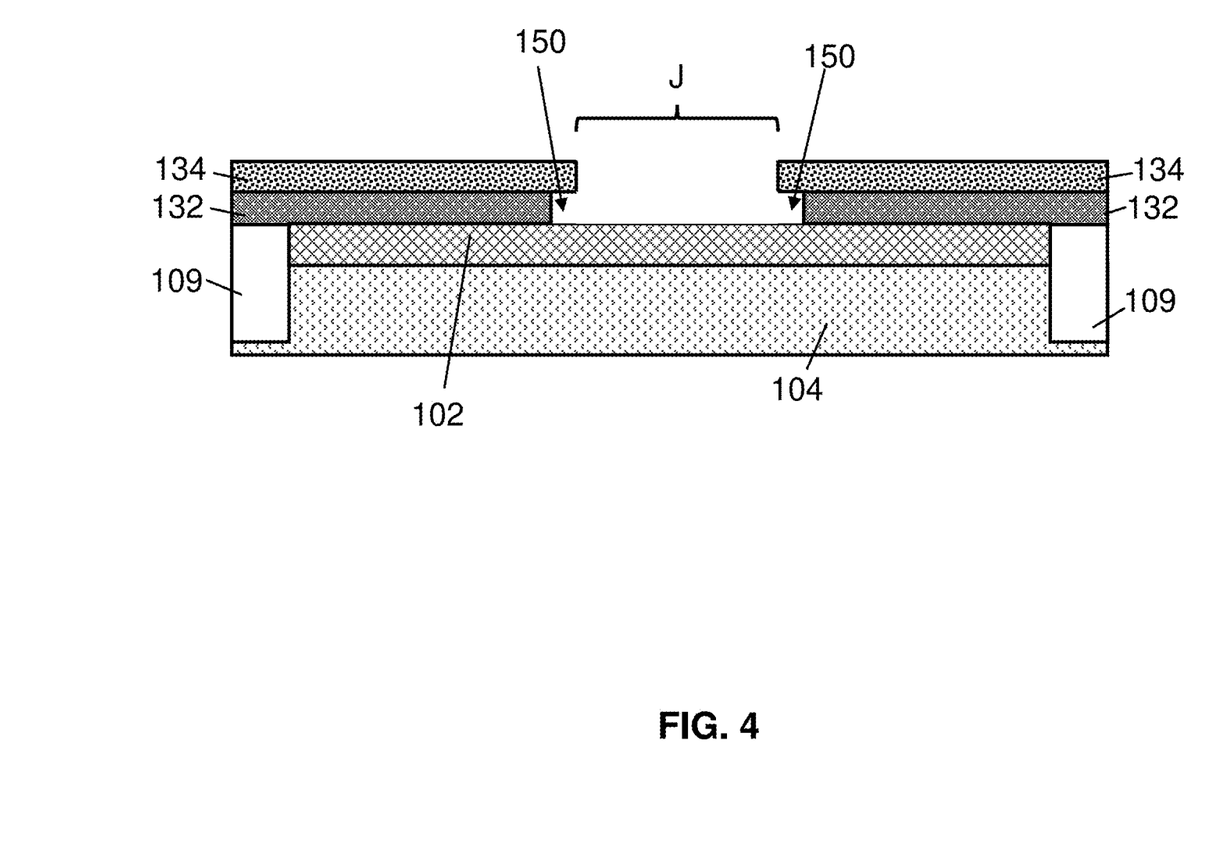
FIGS. 4-10 depict cross-sectional views of processes in methods to form a structure according to embodiments of the disclosure.

Turning to FIG. 4, methods of forming structure(s) 100 (FIGS. 1-3) according to embodiments of the disclosure are discussed. Initial phases of processing may include forming subcollector 102 on substrate 104 (e.g., by targeted doping of semiconductor material to desired concentrations), forming insulator(s) 109 and/or other isolating materials adjacent subcollector 102 and substrate 104, etc. Further processing may include forming first isolation layer 132 on subcollector 102 and insulator(s) 109 and second isolation layer 134 on first isolation layer 132, e.g., by forming two layers of insulating material by deposition or other currently known or later developed techniques to provide insulator materials. As discussed herein, first isolation layer 132 may be oxide based and second isolation layer 134 may be nitride based (or vice versa), but various other compositions are possible. Methods of the disclosure may include forming an opening J within layers 132, 134, e.g., via one or more forms of etching. The process(es) implemented to form opening J may terminate at the upper surface of subcollector 102 for instance by controlling the etch time to form opening J and/or by using any currently known or later developed selective etchants operable to remove layers 132, 134 material(s) without significantly removing or otherwise affecting semiconductor materials (e.g., subcollector 102). Where applicable, etching may be implemented in multiple phases and with multiple etchants such that the width of opening J between remaining parts of first isolation layer 132 is larger than the width of opening J between remaining parts of second isolation layer 134. The forming of opening J may produce undercut regions 150 beneath second isolation layer 134. Undercut regions 150, once formed, may enable first gap(s) 138 (FIGS. 1-3) to be formed during subsequent processing to form collector 106 (FIGS. 1-3) and intrinsic base 112 (FIGS. 1-3) of bipolar transistor 110. For example, in some embodiments, an upper portion of opening J can be formed in second isolation layer 134 using lithographic patterning and anisotropic etch techniques. In this case, the anisotropic etch can be selective for the material of the second isolation layer 134 to that it stops at first isolation layer 132. Then, a lower portion of opening J can be formed in first isolation layer 132 using an isotropic etch process. In this case, the isotropic etch process can be selective for first isolation layer 132 so that it stops at subcollector 102 and also so that it undercuts second isolation layer 134 (i.e., so the lower portion is wider than the upper portion).

Figure 5:
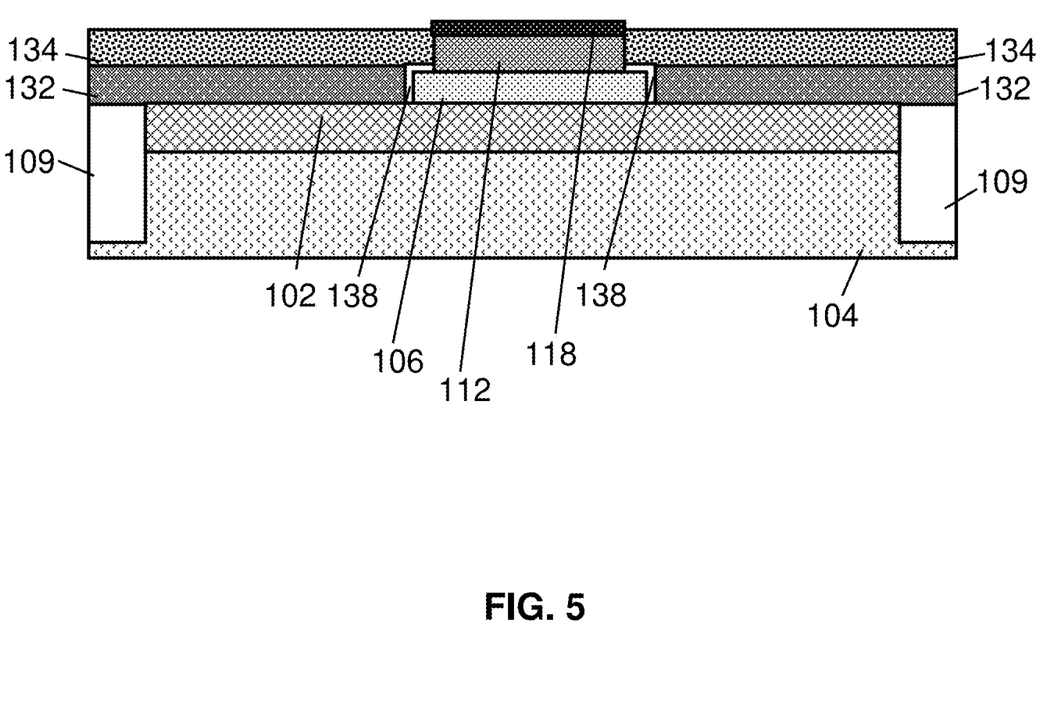

Turning to FIG. 5, further processing in methods of the disclosure may include forming collector 106 in the wider lower portion of opening J (FIG. 4) and intrinsic base 112 on collector 106 in the narrower upper portion of opening J to define first air gaps 138. Forming of collector 106 and intrinsic base 112 may be implemented by selective epitaxial growth and/or doping of semiconductor materials within trench opening J. As shown, such processing may include forming collector 106 on subcollector 102, in which collector 106 and subcollector 102 have a same doping type but collector 106 has a lower doping concentration. In the case of forming by epitaxial growth, collector 106 may have sidewall shapes dependent on the manner of growth implemented and/or the crystallographic orientation of subcollector 102 thereunder. Due to the shape of opening J and undercut regions 152 (FIG. 4) therein, collector 106 may not completely horizontally fill opening J once formed.

Further processing may include, e.g., forming intrinsic base 112 as a monocrystalline semiconductor material on collector 106 as a monocrystalline semiconductor material over intrinsic base 112. Intrinsic base 112 may have an opposite doping type from collector 106, and in addition, may have a lower concentration of dopants therein. Collector 106 and/or intrinsic base 112 may be doped through implantation and/or other currently known or later developed doping techniques. The forming of intrinsic base 112 may begin only after collector 106 is at or near the height of first isolation layer 132 above subcollector 102. In this case, intrinsic base 112 once formed will horizontally abut second isolation layer 134 but will not fill vacant space alongside collector 106. As a result, first air gaps 138 are defined between collector 106 and first isolation layer 132. As discussed herein, first air gaps 138 may be substantially inverted L-shaped in that each first air gap 138 may be adjacent to a sidewall of collector 106 and, optionally, may extend over an upper corner of collector 106 as a result of the various process(es) selected to form layers 132, 134, collector 106, and/or intrinsic base 112.

Further processing may include non-selective forming of semiconductor film 118 (e.g., a layer of semiconductor material, doped during growth or after growth in situ to have the same conductivity as intrinsic base 112) with a different composition and/or crystallographic orientation on intrinsic base 112. Semiconductor film 118 may be formed such that its upper surface is substantially coplanar with, or optionally located above, adjacent upper surfaces of second isolation layer 134. Semiconductor film 118 may be doped by any conceivable process, e.g., by thermal anneal after semiconductor film 118 is formed. In subsequent processing, semiconductor film 118 may function as a part of intrinsic base 112 but also may provide an etch stop layer to control the location and size of emitter 114 (FIGS. 1-3), as described in various embodiments herein.

Figure 6:
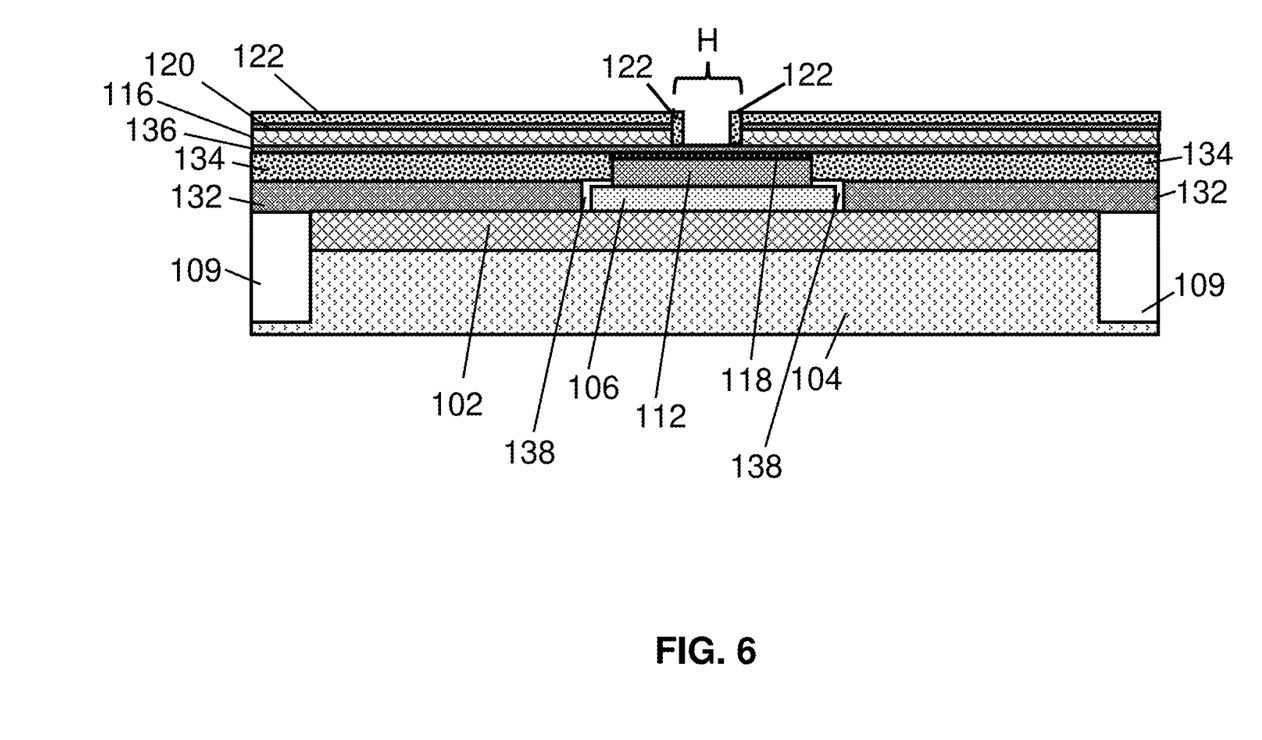

FIG. 6 depicts further stages of processing, e.g., forming third isolation layer 136 on second isolation layer 134 and semiconductor film 118 and thereafter forming additional layers on third isolation layer 136. Additional layers to be formed on third isolation layer 136 may include extrinsic base 116 material (polycrystalline silicon with dopants therein) on third isolation layer 136, first spacer 120 layer (e.g., oxide based insulators or other insulative material(s)) on extrinsic base material 116, and second spacer 122 layer (e.g., nitride based insulators or other insulative material(s)). Third isolation layer 136 may include any currently known or later developed insulative material, and in an example may include an oxide based insulator. Third isolation layer 136, as also discussed herein, may have a similar composition to first isolation layer 132 but may have a different composition from second isolation layer 134. Initially, third isolation layer 136, extrinsic base 116, and spacers 120, 122 layers all may be in the form of layers extending horizontally over semiconductor film 118 and second isolation layer 134.

To prepare the structure for further processing (e.g., forming of emitter 114 (FIGS. 1-3), second air gap(s) 139 (FIGS. 1-3, etc.) the disclosure may include forming an opening H over semiconductor film 118. To form opening H, a temporary mask (not shown) and etching may be used to remove targeted portions of extrinsic base 116 and spacers 120, 122 layers. Opening H, initially, may be formed by only partial etching through the layer of extrinsic base 116 material (i.e., third isolation layer 136 is not exposed). Additional portions of second spacer 122 material(s) then may be formed in opening H by conformal deposition. Further processing may include continued removal of extrinsic base 116 material to expose third isolation layer 136 thereunder. In this case, third isolation layer 136 may function as an etch stop layer to prevent exposure of semiconductor film 118 and/or intrinsic base 112 as opening H is formed.

Figure 7:
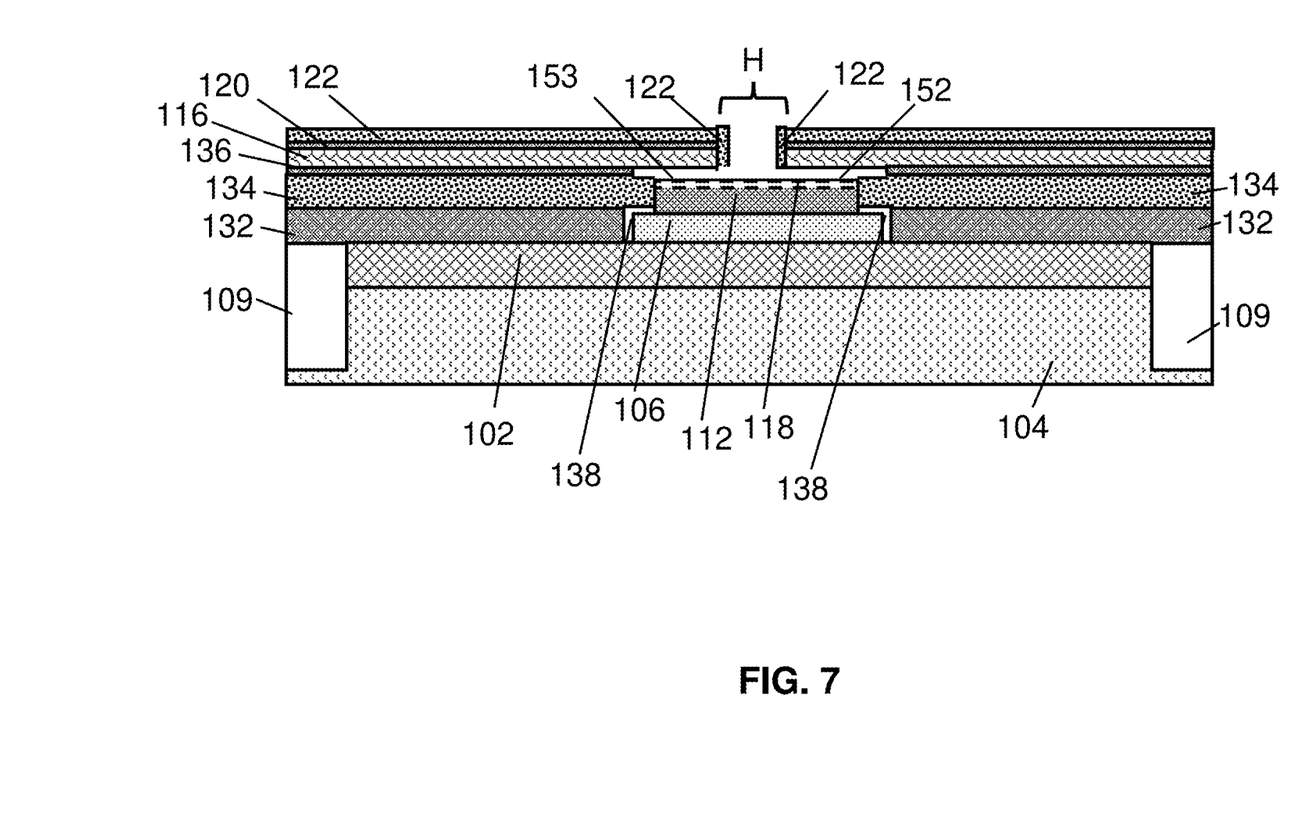

FIG. 7 depicts further processing to prepare intrinsic base 112 for emitter 114 (FIGS. 1-3) formation thereover. Further processing may include removing semiconductor film 118 and portions of third isolation layer 136 with selective etchants and/or other techniques to remove only the composition of semiconductor film 118 and portions of third isolation layer 136 without removing other materials, e.g., portions of intrinsic base 112. Due to the position of semiconductor film 118 below third isolation layer 136, the selective removing of semiconductor film 118 may create a set of undercut regions 152 as empty space previously occupied isolation layer 136, extending horizontally away from intrinsic base 112 by a span dependent on the amount of etchant(s) applied. Undercut regions 152 enable second air gaps 139 (FIGS. 1-3) to be formed in subsequent processing. The removing of semiconductor film 118 also re-exposes underlying portions of intrinsic base 112 and allows further portions of bipolar transistor 110 (FIGS. 1-3) to be formed. Optionally, portions of semiconductor film 118 (shown with dashed lines for emphasis) may remain intact, i.e., only a portion of semiconductor film 118 may be removed to form undercut regions 152.

Figure 8:
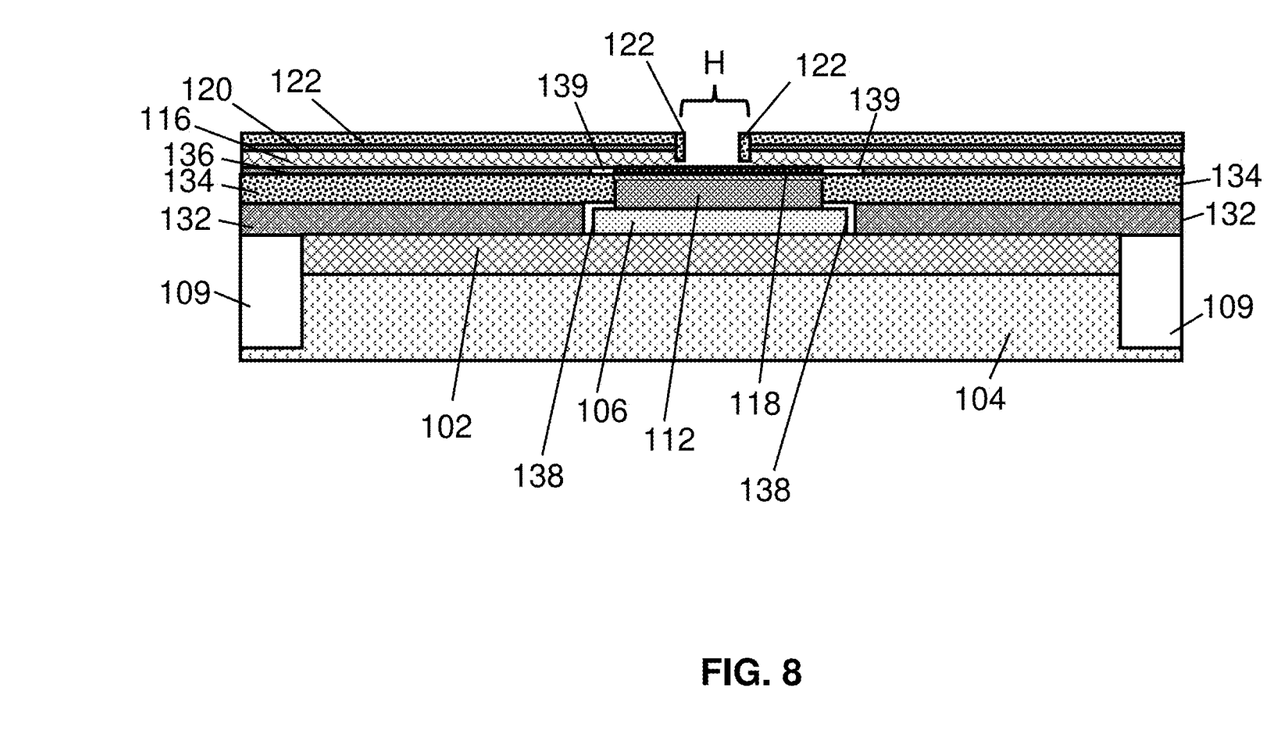

Continuing to FIG. 8, methods of the disclosure may include re-forming removed portions of semiconductor film 118, which optionally may have a different composition from semiconductor film(s) 118 used in earlier phases of processing. In certain implementations, semiconductor film 118 may be formed as a wholly new layer of material, but semiconductor film 118 may be regrown on remaining portions of semiconductor film 118 in other embodiments. The re-forming of semiconductor film 118 may include epitaxial growth and/or deposition within opening H, such that semiconductor film 118 is formed on intrinsic base 112 but not completely over adjacent portions of isolation stack 130 (e.g., second isolation layer 134). Semiconductor film 118 may not be formed vertically between second isolation layer 134 and extrinsic base 116 thereover, e.g., due to selective deposition and growth of semiconductor material on intrinsic base 112 but not on insulative material within isolation stack 130. As a result, second air gaps 139 may be defined within, or adjacent to, isolation stack 130 after the re-forming of semiconductor film 118 concludes. In addition, semiconductor film 118 may be formed to a selected height such that second air gaps 139 are confined horizontally between isolation stack 130 and intrinsic base 112, but remaining portions of opening H are still unfilled.

Figure 9:
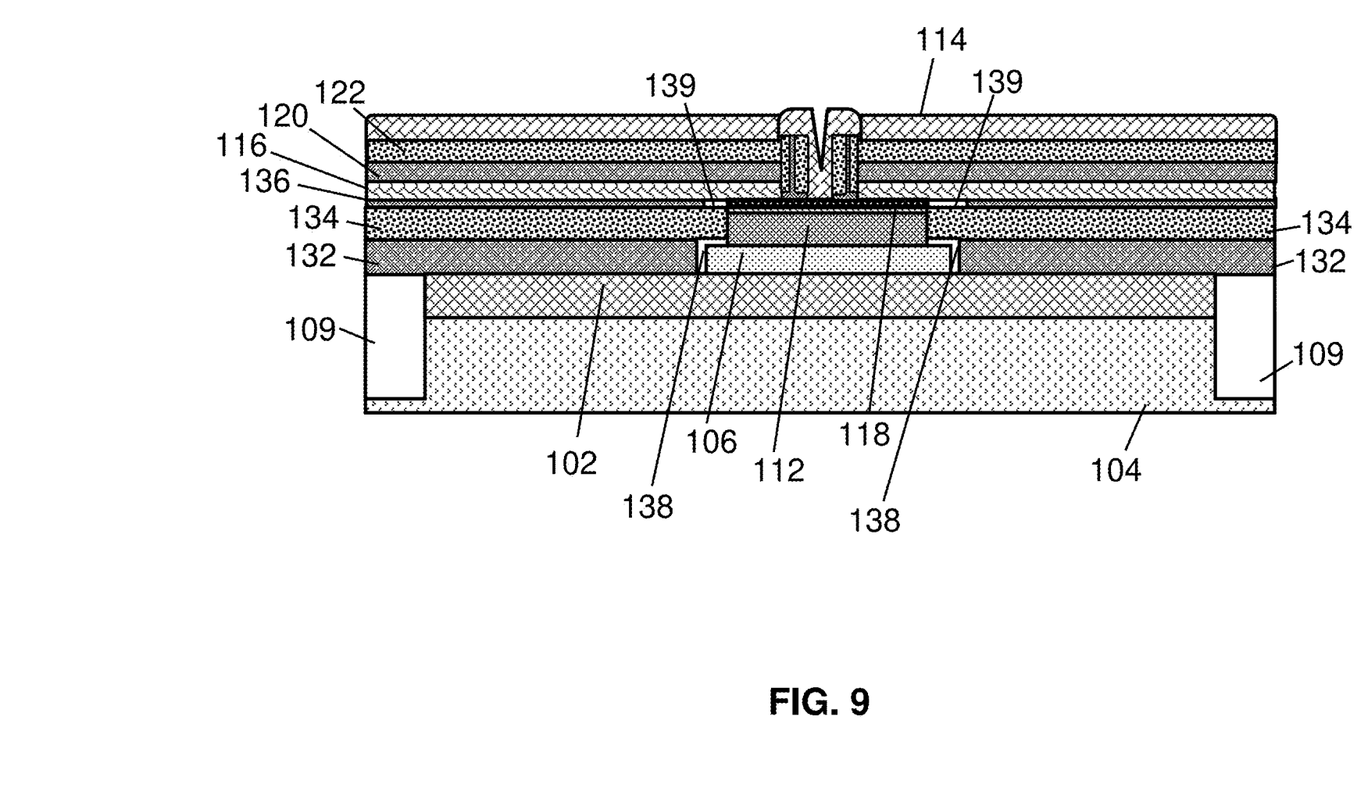

FIG. 9 depicts further processing to form emitter 114, e.g., by deposition on extrinsic base 116 material and within opening H (FIG. 8). The forming of emitter 114 may include, e.g., conformal deposition, etching, and doping of semiconductor material such that emitter 114 has a desired size and doping concentration. Emitter 114 may fill opening H and depending on the size and shape of opening P, portions of emitter 114 may define a valley horizontally between spacers 120, 122 and portions of extrinsic base 116. In some cases, emitter 114 may be formed to a greater height and may be planarized to prevent such valleys from forming, but these additional processes are not required. Emitter 114, initially, may extend completely over the uppermost layer of material (e.g., second spacer 122) beyond locations over collector 106 and intrinsic base 112. Emitter 114 may be doped to have the same doping type as subcollector 102 and collector 106, e.g., P-type or N-type doping based on whether the eventual bipolar transistor 110 will have a PNP or NPN configuration.

Figure 10:
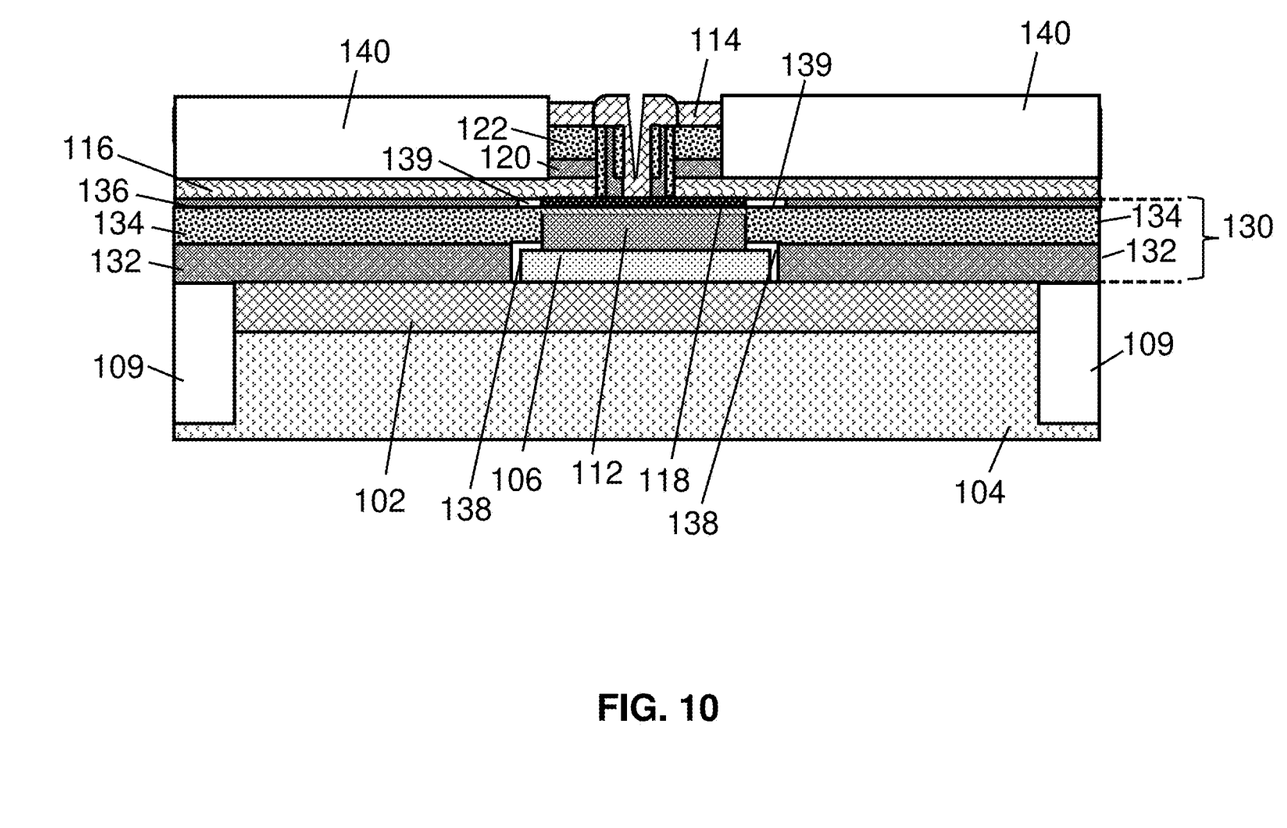

Referring to FIGS. 1 and 10 together, further processing to form structure 100 (FIGS. 1-3) may include removing portions of spacers 120, 122 and forming ILD layer 140. Emitter 114 and adjacent portions of intrinsic base 116, spacers 120, 122 may be covered by a temporary mask and adjacent portions of material may be removed (e.g., by downward etching) to the depth of extrinsic base(s) 116 therebelow. Structure 100 (FIGS. 1-3) may be created by removing additional portions of isolation stack 130 and overlying portions of extrinsic base 116 beyond a desired span (e.g., using an additional mask), and forming silicide layer(s) 148 (FIGS. 1-3). ILD layer 140 then can be formed, e.g., by depositing of appropriate insulative material(s), such as oxide-based or nitride-based insulators. Further processing includes forming contact(s) 142, 144 146 by removing portions of ILD 140 and forming conductive material(s) therein according to conventional processing techniques. The continued presence of isolation stack 130 in certain locations may prevent any ILD layer 140 material from entering air gaps 138, 139.

Embodiments of the disclosure provide various technical and commercial advantages, examples of which are discussed herein. Embodiments of the disclosure are operable to reduce, or altogether prevent, electrical shorting from extrinsic base(s) 116 to collector 106 thereunder by providing multiple air gaps 138, 139 alongside intrinsic base 112. The shape and presence of air gaps 138, 139 may contribute to vertical electrical insulation provided by isolation stack(s) 130 alongside collector 106 and portions of intrinsic base 112. The processing configurations to form embodiments of structure 100, e.g., by including isolation stack 130 and air gaps 138, 139, allows extrinsic base 116 to be formed more reliably than comparable processing schemes to provide bipolar transistor(s) 110. Embodiments of the disclosure discussed herein also yield additional benefits, e.g., greater control over forming and shaping of emitter 114, as air gaps 138, 139 and isolation stack 130 allow a variety of emitter 114 configurations (e.g., multi-finger emitters 114 as shown in FIG. 3 and discussed herein) to be provided. Among other benefits, the improved electrical isolation reduces resistance within the base terminal of a transistor and enables better growth of crystalline extrinsic base than may be possible in conventional vertical bipolar transistors. Related technical benefits may include, e.g., reduction in parasitic capacitance between the base(s) and other active portions of a bipolar transistor.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
    a first isolation layer on a subcollector, wherein a first air gap is between the first isolation layer and a collector of a bipolar transistor (BT);
    a second isolation layer on the first isolation layer and adjacent an intrinsic base of the BT; and
    a third isolation layer on the second isolation layer, vertically between the second isolation layer and an extrinsic base of the BT, wherein a second air gap is adjacent the third isolation layer and below the extrinsic base, and wherein the second isolation layer defines a physical boundary between the first air gap and the second air gap.

2. The structure of claim 1, wherein the second isolation layer is adjacent a lower portion of the intrinsic base of the BT, and wherein the second air gap is adjacent an upper portion of the intrinsic base of the BT.

3. The structure of claim 1, wherein the first isolation layer and the third isolation layer each include a same material.

4. The structure of claim 1, wherein the first isolation layer, the second isolation layer, and the third isolation layer form an oxide-nitride-oxide (ONO) stack.

5. The structure of claim 1, wherein the first air gap is one of a pair of first air gaps each adjacent a sidewall of the collector, and wherein the second air gap is one of a pair of second air gaps each adjacent a sidewall of the intrinsic base.

6. The structure of claim 1, wherein the BT is a vertically-oriented heterojunction bipolar transistor.

7. A structure comprising:
    a bipolar transistor (BT) including a subcollector, a collector on the subcollector, an intrinsic base on the collector, an extrinsic base on a first portion of the intrinsic base, and an emitter on a second portion of the intrinsic base; and
    an isolation stack adjacent the BT, the isolation stack including:
        a first isolation layer on the subcollector, wherein a first air gap is between the first isolation layer and the collector, and wherein a portion of the first air gap is above a portion of the collector;
        a second isolation layer on the first isolation layer and adjacent the intrinsic base of the BT; and
        a third isolation layer on the second isolation layer, vertically between the second isolation layer and the extrinsic base of the BT, wherein a second air gap is adjacent the third isolation layer and below the extrinsic base, wherein the second isolation layer defines a physical boundary between the first air gap and the second air gap.

8. The structure of claim 7, wherein the second isolation layer of the isolation stack is adjacent a lower portion of the intrinsic base of the BT, and wherein the second air gap is adjacent an upper portion of the intrinsic base of the BT.

9. The structure of claim 7, wherein the first isolation layer and the third isolation layer each include a same material.

10. The structure of claim 7, wherein the first isolation layer, the second isolation layer, and the third isolation layer form an oxide-nitride-oxide (ONO) stack.

11. The structure of claim 7, wherein the emitter of the BT is one of a plurality of emitters on the second portion of the intrinsic base.

12. A method comprising:
    forming a first isolation layer on a subcollector, wherein a first air gap is between the first isolation layer and a collector of a bipolar transistor (BT);
    forming a second isolation layer on the first isolation layer and adjacent an intrinsic base of the BT; and
    forming a third isolation layer on the second isolation layer, vertically between the second isolation layer and an extrinsic base of the BT, wherein a second air gap is adjacent the third isolation layer and below the extrinsic base, wherein forming the second isolation layer defines a physical boundary between the first air gap and the second air gap.

13. The method of claim 12, wherein the second isolation layer is adjacent a lower portion of the intrinsic base of the BT, and wherein the second air gap is adjacent an upper portion of the intrinsic base of the BT.

14. The method of claim 12, wherein the first isolation layer and the third isolation layer each include a same material.

15. The method of claim 12, wherein forming the first isolation layer, the second isolation layer, and the third isolation layer includes forming an oxide-nitride-oxide (ONO) stack.

16. The method of claim 12, wherein the first air gap is one of a pair of first air gaps each adjacent a sidewall of the collector, and wherein the second air gap is one of a pair of second air gaps each adjacent a sidewall of the intrinsic base.

17. The method of claim 12, further comprising forming the BT as a vertically-oriented heterojunction bipolar transistor on the subcollector.

* * * * *